(12) United States Patent
Wang et al.

(10) Patent No.: US 12,035,603 B2
(45) Date of Patent: Jul. 9, 2024

(54) DISPLAY PANEL AND DISPLAY DEVICE

(71) Applicant: BOE TECHNOLOGY GROUP CO., LTD., Beijing (CN)

(72) Inventors: Lei Wang, Beijing (CN); Haisheng Wang, Beijing (CN); Yingming Liu, Beijing (CN); Peng Jia, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 405 days.

(21) Appl. No.: 17/419,403

(22) PCT Filed: Feb. 13, 2020

(86) PCT No.: PCT/CN2020/075050
§ 371 (c)(1),
(2) Date: Jun. 29, 2021

(87) PCT Pub. No.: WO2021/159379
PCT Pub. Date: Aug. 19, 2021

(65) Prior Publication Data
US 2022/0320197 A1    Oct. 6, 2022

(51) Int. Cl.
*G06V 40/13*     (2022.01)
*H10K 59/122*    (2023.01)
(Continued)

(52) U.S. Cl.
CPC ......... *H10K 59/60* (2023.02); *G06V 40/1318* (2022.01); *H10K 59/122* (2023.02);
(Continued)

(58) Field of Classification Search
CPC .... H10K 59/60; H10K 59/122; H10K 59/124; H10K 59/126; H10K 59/65; H10K 59/121; H10K 59/38; G06V 40/1318
See application file for complete search history.

(56) References Cited

U.S. PATENT DOCUMENTS 9,755,029 B1    9/2017 Goktepeli
11,462,598 B2 * 10/2022 Li ..................... H10K 59/124
(Continued)

FOREIGN PATENT DOCUMENTS

CN    105304673 A    2/2016
CN    106773219 A    5/2017
(Continued)

*Primary Examiner* — S M Sohel Imtiaz
(74) *Attorney, Agent, or Firm* — The Webb Law Firm

(57) ABSTRACT

A display panel and a display device are provided. The display panel includes: a substrate; a driving circuit layer including a plurality of first thin film transistors and a second thin film transistor located on the substrate, wherein the second thin film transistor is located between adjacent first thin film transistors; a plurality of light-emitting elements located on one side of the driving circuit layer away from the substrate, and electrically connected to the plurality of first thin film transistors respectively; a photosensitive element located between adjacent light-emitting elements and electrically connected to the second thin film transistor; and a photoresist element located on an optical path of ambient light transmitted to a thin film transistor channel of the second thin film transistor within the display panel, so as to reduce ambient light transmitted to a thin film transistor channel of the second thin film transistor.

19 Claims, 5 Drawing Sheets

(51) Int. Cl.
*H10K 59/124* (2023.01)
*H10K 59/126* (2023.01)
*H10K 59/60* (2023.01)
*H10K 59/65* (2023.01)

(52) U.S. Cl.
CPC ......... *H10K 59/124* (2023.02); *H10K 59/126* (2023.02); *H10K 59/65* (2023.02)

(56) References Cited

U.S. PATENT DOCUMENTS

| | | |
|---|---|---|
| 11,469,261 B2 | 10/2022 | Ban et al. |
| 2005/0082540 A1 | 4/2005 | Nishikawa |
| 2007/0090365 A1 | 4/2007 | Hayashi et al. |
| 2008/0079565 A1* | 4/2008 | Koyama ............... H01L 23/66 340/539.1 |
| 2012/0217515 A1* | 8/2012 | Yamazaki ............. H10K 59/38 257/E33.053 |
| 2015/0364527 A1 | 12/2015 | Wang et al. |
| 2016/0254276 A1 | 9/2016 | Tada et al. |
| 2018/0158877 A1 | 6/2018 | Zeng et al. |
| 2018/0225500 A1* | 8/2018 | Han .................. G06V 40/1318 |
| 2018/0329247 A1* | 11/2018 | Cho ................... H01L 27/1222 |
| 2019/0006523 A1 | 1/2019 | Nakatsuji |
| 2019/0043420 A1* | 2/2019 | Jung .................. G09G 3/3225 |
| 2019/0131325 A1 | 5/2019 | Liu et al. |
| 2019/0156097 A1 | 5/2019 | Liu et al. |
| 2019/0172886 A1 | 6/2019 | Ma et al. |
| 2019/0206945 A1 | 7/2019 | Lin et al. |
| 2019/0386033 A1* | 12/2019 | Li ....................... H01L 27/124 |
| 2020/0044004 A1 | 2/2020 | Wang et al. |
| 2020/0052241 A1 | 2/2020 | Li et al. |
| 2020/0201117 A1 | 6/2020 | Zheng et al. |
| 2020/0328260 A1 | 10/2020 | Tang |
| 2021/0050469 A1 | 2/2021 | Zhou et al. |
| 2021/0157441 A1* | 5/2021 | Chen .................... G06F 3/0412 |
| 2021/0335917 A1 | 10/2021 | Wang |

FOREIGN PATENT DOCUMENTS

| | | | |
|---|---|---|---|
| CN | 108831912 A | * 11/2018 | ........... G09G 3/3233 |
| CN | 108831912 A | 11/2018 | |
| CN | 109004015 A | 12/2018 | |
| CN | 109273497 A | 1/2019 | |
| CN | 109285870 A | 1/2019 | |
| CN | 109521605 A | 3/2019 | |
| CN | 109541839 A | 3/2019 | |
| CN | 110047906 A | 7/2019 | |
| CN | 110164384 A | 8/2019 | |
| CN | 110164946 A | 8/2019 | |
| CN | 110265457 A | 9/2019 | |
| CN | 110444553 A | 11/2019 | |
| CN | 110600527 A | 12/2019 | |
| CN | 110678983 A | 1/2020 | |
| EP | 1906467 A2 | 4/2008 | |
| FR | 3082025 A1 | 12/2019 | |
| KR | 1020090065182 A | 6/2009 | |
| WO | 2018176978 A1 | 10/2018 | |
| WO | 2019085973 A1 | 5/2019 | |
| WO | 2020057036 A1 | 3/2020 | |
| WO | 2021031117 A1 | 2/2021 | |

\* cited by examiner

DISPLAY PANEL AND DISPLAY DEVICE

CROSS-REFERENCE TO RELATED APPLICATION

The present application is a U.S. National Stage Application under 35 U.S.C. § 371 of International Patent Application No. PCT/CN2020/075050, filed on Feb. 13, 2020, the disclosure of which is incorporated by reference herein in its entirety.

TECHNICAL FIELD

The present disclosure relates to display technology, and particularly to a display panel and a display device.

BACKGROUND

In some related technologies, the Organic Light-Emitting Diode (referred to as OLED) display screen integrates a fingerprint recognition function. In the OLED display screen, the photosensitive element as a fingerprint sensor is located above the OLED backplane and between a plurality of OLED light-emitting pixels.

SUMMARY

In one aspect of the present disclosure, a display panel is provided. The display panel includes: a substrate; a driving circuit layer including a plurality of first thin film transistors and a second thin film transistor located on the substrate, wherein the second thin film transistor is located between adjacent first thin film transistors among the plurality of first thin film transistors; a plurality of light-emitting elements located on one side of the driving circuit layer away from the substrate, and electrically connected to the plurality of first thin film transistors respectively; a photosensitive element located between adjacent light-emitting elements among the plurality of light-emitting elements and electrically connected to the second thin film transistor; and a light-blocking element located on an optical path of ambient light from outside the display panel transmitted to a thin film transistor channel of the second thin film transistor within the display panel, so as to reduce ambient light transmitted to the thin film transistor channel of the second thin film transistor.

In some embodiments, at least one of the plurality of light-emitting elements is an organic light-emitting diode comprising an anode layer electrically connected to first electrodes of the first thin film transistors; a second electrode of the second thin film transistor is in the same layer as the first electrodes of the first thin film transistors; and the light-blocking element comprises an extension portion of the second electrode extending toward the first electrodes, wherein an orthographic projection of the extension portion on the substrate at least partially overlaps with an orthographic projection of the anode layer on the substrate.

In some embodiments, an orthographic projection of the photosensitive element on the substrate does not overlap with an orthographic projection of the anode layer on the substrate.

In some embodiments, the display panel further includes a planarization layer located between the driving circuit layer and the plurality of light-emitting elements, wherein: the photosensitive element is located within the planarization layer; and the anode layer of the organic light-emitting diode is located on one side of the planarization layer away from the driving circuit layer, and electrically connected to the first electrodes of the first thin film transistors through a via hole within the planarization layer.

In some embodiments, the substrate is a glass substrate, and the light-blocking element includes a light-absorbing layer located on a surface of one side of the glass substrate away from the driving circuit layer.

In some embodiments, the second thin film transistor further includes: an active layer located on one side of the substrate adjacent to the photosensitive element; and a first gate layer located on one side of the active layer away from the substrate; wherein the light-blocking element includes: a second gate layer located between the substrate and the active layer, wherein at least part of an orthographic projection of the second gate layer on the substrate overlaps with an orthographic projection of the first gate layer on the substrate.

In some embodiments, the light-blocking element includes a first light-shielding layer, the first light-shielding layer, as a planarization layer, is located between the driving circuit layer and the plurality of light-emitting elements to block ambient light from entering the driving circuit layer.

In some embodiments, the photosensitive element is located within the first light-shielding layer and exposed on one side of the first light-shielding layer away from the driving circuit layer.

In some embodiments, the display panel further includes: a planarization layer located between the driving circuit layer and the plurality of light-emitting elements; and a pixel defining layer located on one side of the planarization layer away from the driving circuit layer, wherein material of at least one of the planarization layer or the pixel defining layer is a filter material configured to intercept light with a wavelength higher than a set wavelength and transmit light with the wavelength not higher than a set wavelength.

In some embodiments, the display panel further includes a filter layer located on one side of the photosensitive element away from the driving circuit layer, wherein material of the filter layer is a filter material configured to intercept light with a wavelength higher than a set wavelength, and transmit light with a wavelength not higher than the set wavelength, and at least part of an orthographic projection of the filter layer on the substrate overlaps with an orthographic projection of the photosensitive element on the substrate.

In some embodiments, the light-blocking element includes a second light-shielding layer, the second light-shielding layer, as a pixel defining layer, is located on one side of the driving circuit layer away from the substrate; and the filter layer is arranged within the second light-shielding layer, and exposed on one side of the second light-shielding layer away from the driving circuit layer.

In some embodiments, the set wavelength is 550-620 nm.

In some embodiments, the set wavelength is 600 nm.

In some embodiments, at least one of the plurality of light-emitting elements is an organic light-emitting diode including: an anode layer located between the pixel defining layer and the planarization layer, and having an exposed portion relative to at least one of the plurality of openings; an organic light-emitting layer located within at least one of the plurality of openings and covering a surface of the exposed portion of the anode layer; and a cathode layer covering surfaces of the pixel defining layer and the organic light-emitting layer.

In some embodiments, the photosensitive element includes: an N-type amorphous silicon layer, an amorphous silicon layer, and a P-type amorphous silicon layer that are sequentially stacked along a direction away from the driving circuit layer.

In some embodiments, the photosensitive element is applied for fingerprint identification.

In another aspect of the present disclosure, a display device is provided. The display device includes: the display panel as described previously.

BRIEF DESCRIPTION OF THE DRAWINGS

The accompanying drawings, which constitute part of this specification and illustrate the exemplary embodiments of the present disclosure, together with this specification, serve to explain the principles of the present disclosure.

The present disclosure may be more explicitly understood from the following detailed description with reference to the accompanying drawings, in which.

Figure 1:
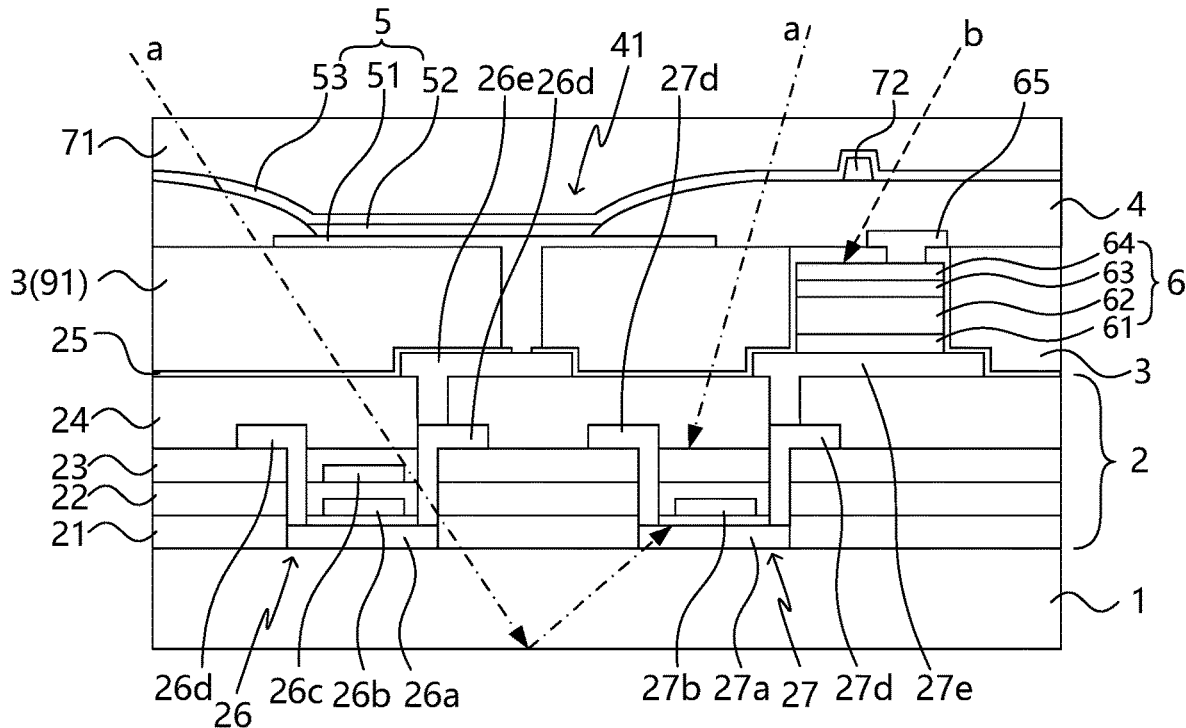
FIGS. 1 to 10 are respectively schematic cross-sectional views of some embodiments of the display panel according to the present disclosure.

It should be understood that the dimensions of various parts shown in the accompanying drawings are not drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The fingerprint sensor of the OLED display screen in the related art is located above the OLED backplane, and thus presents a high transmittance. Accordingly, the light entering the fingerprint sensor from stray light in ambient environment is greatly increased. Generally, the illuminance of the RGB signal light after reaching the fingerprint sensor is in the order of $10^{-1}$ 1×, while the stray light in ambient environment is much stronger than the RGB signal light, which may be up to 100,000 1×. The stray light may also reach the order of $10^1 \sim 10^2$ 1× even after passing through a finger to reach the fingerprint sensor, which makes it difficult for the signal light to be discerned by the fingerprint sensor.

After research, it has been found that the effects of the stray light in the environment on performance of the sensor consist in two aspects: on one hand, when the stray light is irradiated to the fingerprint sensor, the stray light can saturate the photodiode PIN of the fingerprint sensor, and it is also possible to significantly reduce the contrast of valleys and ridges of the fingerprint even if saturation is not realized; on the other hand, the thin film transistors (referred to as TFT) of some OLED display screens use a Low Temperature Poly-silicon (referred to as LTPS) process, while leakage current (Ioff) may be greatly increased when LTPS TFT is subjected to strong light irradiation, thereby reducing the signal volume of the fingerprint sensor and increasing the noise.

In view of this, the embodiments of the present disclosure provide a display panel and a display device, which can improve the adverse effects of stray light in the environment on the photosensitive elements in the display panel.

FIGS. 1 to 10 are respectively schematic cross-sectional views of some embodiments of the display panel according to the present disclosure.

Referring to FIGS. 1 to 10, in some embodiments, the display panel includes: a substrate 1, a driving circuit layer 2, a plurality of light-emitting elements 5, a photosensitive element 6 and a light-blocking element. The substrate may be made of glass or ceramic. The driving circuit layer 2 is configured to provide a driving current to the devices in the display panel so as to realize the control function of the devices. In FIG. 1, the driving circuit includes a plurality of first TFTs 26 and a second TFT 27 formed on the substrate 1. The second TFT 27 is located between adjacent first TFTs 26 among the plurality of first TFTs 26.

In FIGS. 1 to 4 and FIGS. 8 to 10, the first TFT 26 includes: an active layer 26a, a first gate layer 26b, a second gate layer 26c, a first source and drain layer 26d, and a second source and drain layer 26e. The first source and drain layer 26d can be configured to form a source pole and a drain pole of the first TFT 26. The second source and drain layer 26e is electrically connected to the first source and drain layer 26d.

In some embodiments, the driving circuit layer 2 further includes: a first gate insulating layer 21, a second gate insulating layer 22, an interlayer insulating layer 23, a first passivation layer 24 and a second passivation layer 25. Along a direction away from the substrate (i.e., the vertical direction from bottom to top as shown in FIG. 1), the active layer 26a is arranged on the substrate 1, and the first gate insulating layer 21 is also arranged on the substrate 1 and covers the active layer 26a. The first gate layer 26b is arranged on the first gate insulating layer 21, and the second gate insulating layer 22 is arranged on the first gate insulating layer 21 and covers the first gate layer 26b. The second gate layer 26c is arranged on the second gate insulating layer 22, and the interlayer insulating layer 23 is arranged on the second gate insulating layer 22 and covers the second gate layer 26b. The first source and drain layer 26d is arranged on the interlayer insulating layer 23, and electrically connected to the first active layer 26a through a via hole. The first passivation layer 24 is arranged on the interlayer insulating layer 23 and covers the first source and drain layer 26d. The second source and drain layer 26e is arranged on the first passivation layer 24, and electrically connected to the first source and drain layer 26d through a via hole.

In FIGS. 1 to 4 and 8 to 10, the second TFT 27 includes an active layer 27a, a first gate layer 27b, a first source drain layer 27d, and a second source drain layer 27e. The first source and drain layer 27d can be configured to constitute the source and drain of the second TFT 27. The second source and drain layer 27e is electrically connected to the first source and drain layer 27d.

Along the vertical direction from bottom to top as shown in FIG. 1, the active layer 27a is arranged on the substrate 1, and the first gate insulating layer 21 is also arranged on the substrate 1 and covers the active layer 27a. The third gate layer 27b is arranged on the first gate insulating layer 21, and the second gate insulating layer 22 is arranged on the first gate insulating layer 21 and covers the first gate layer 27b. The first source and drain layer 27d is arranged on the interlayer insulating layer 23, and electrically connected to the active layer 27a through a via hole. The first passivation layer 24 is arranged on the interlayer insulating layer 23 and covers the first source and drain layer 27d. The second source and drain layer 27e is arranged on the first passivation layer 24, and electrically connected to the first source and drain layer 27d through a via hole.

Figure 5:
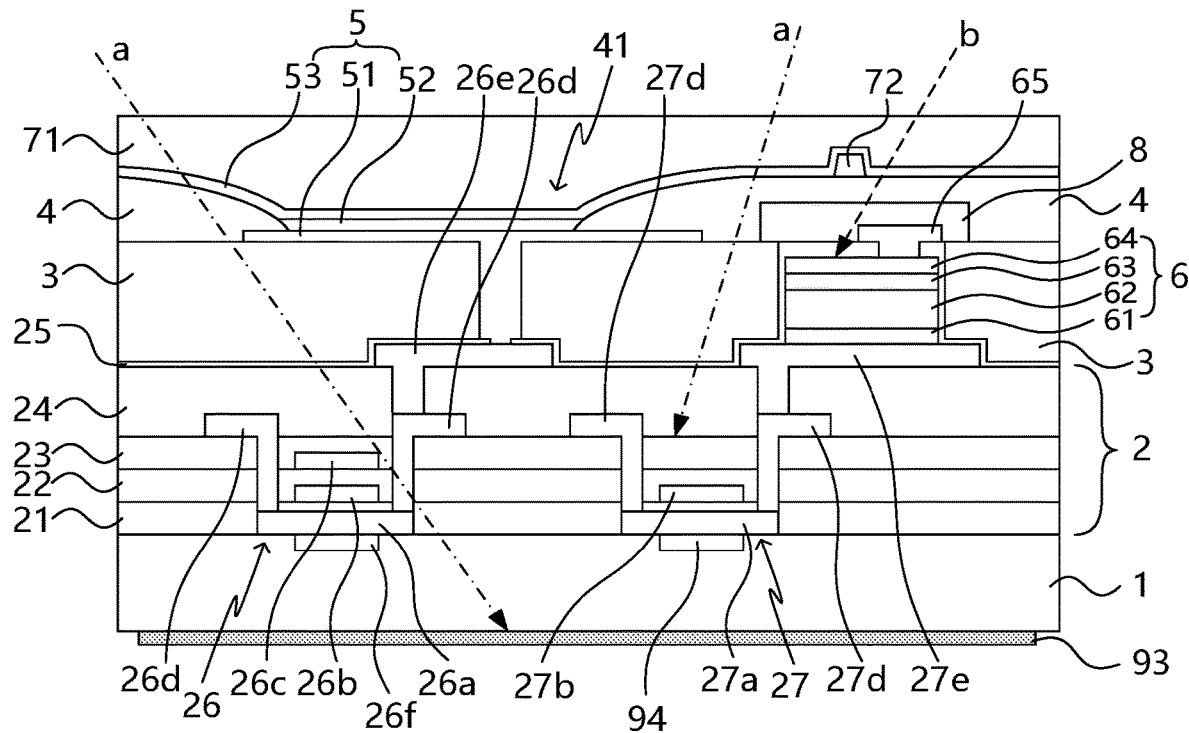
Figure 6:
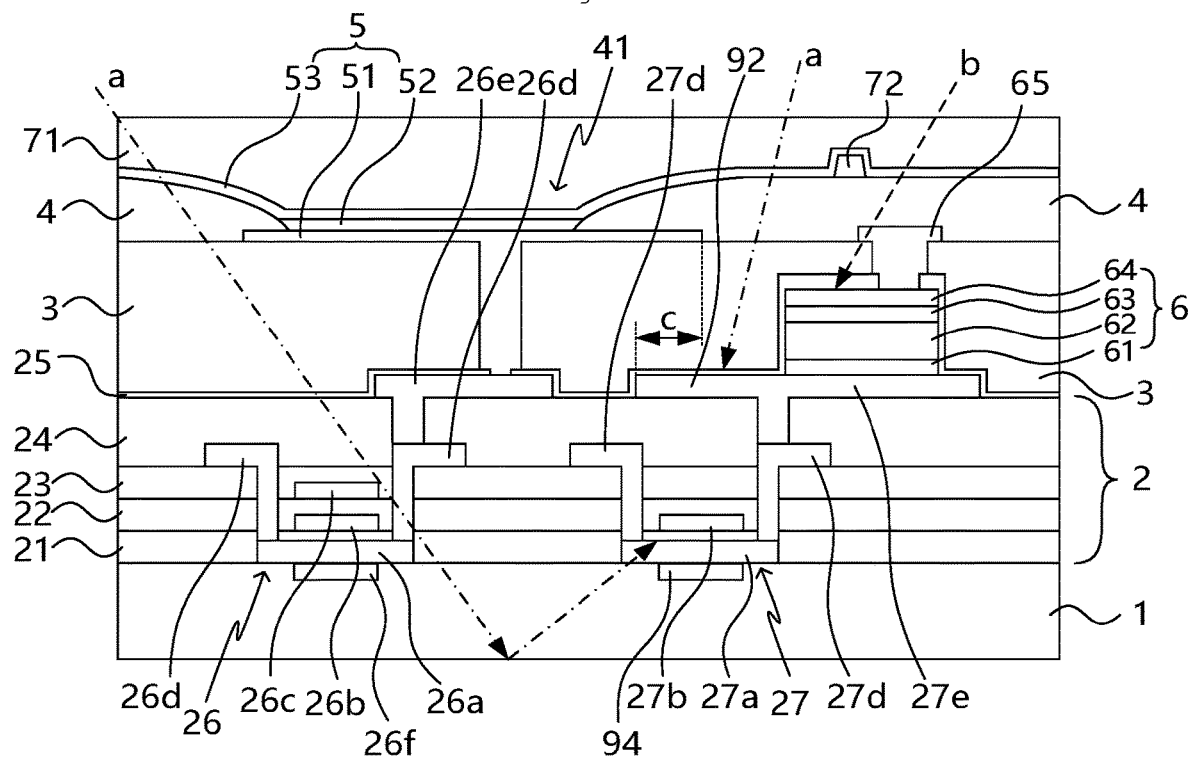
Figure 7:
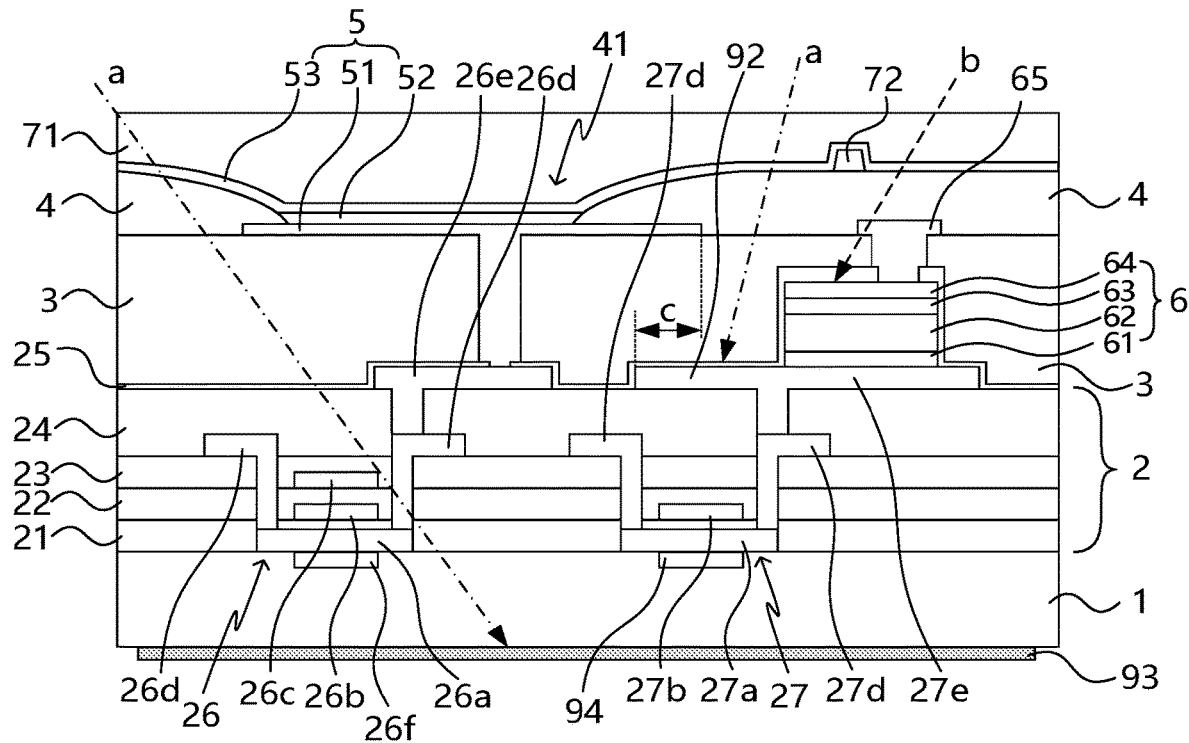
Figure 8:
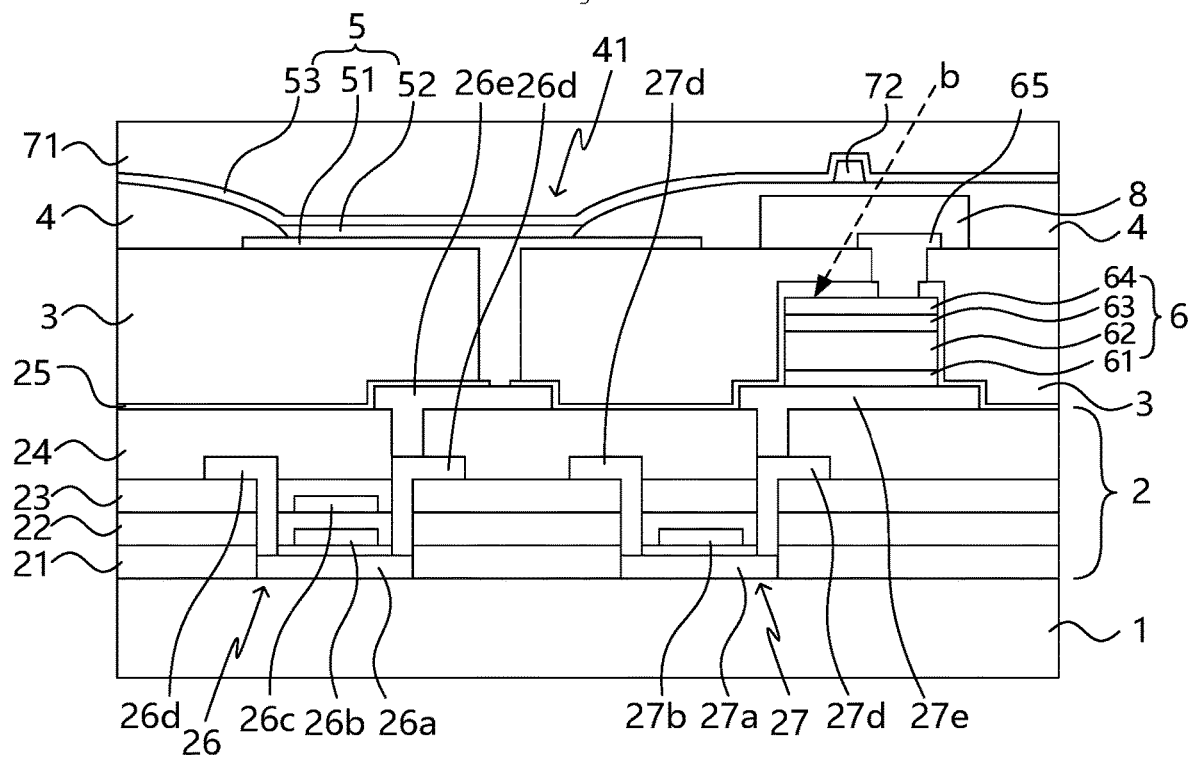
Figure 9:
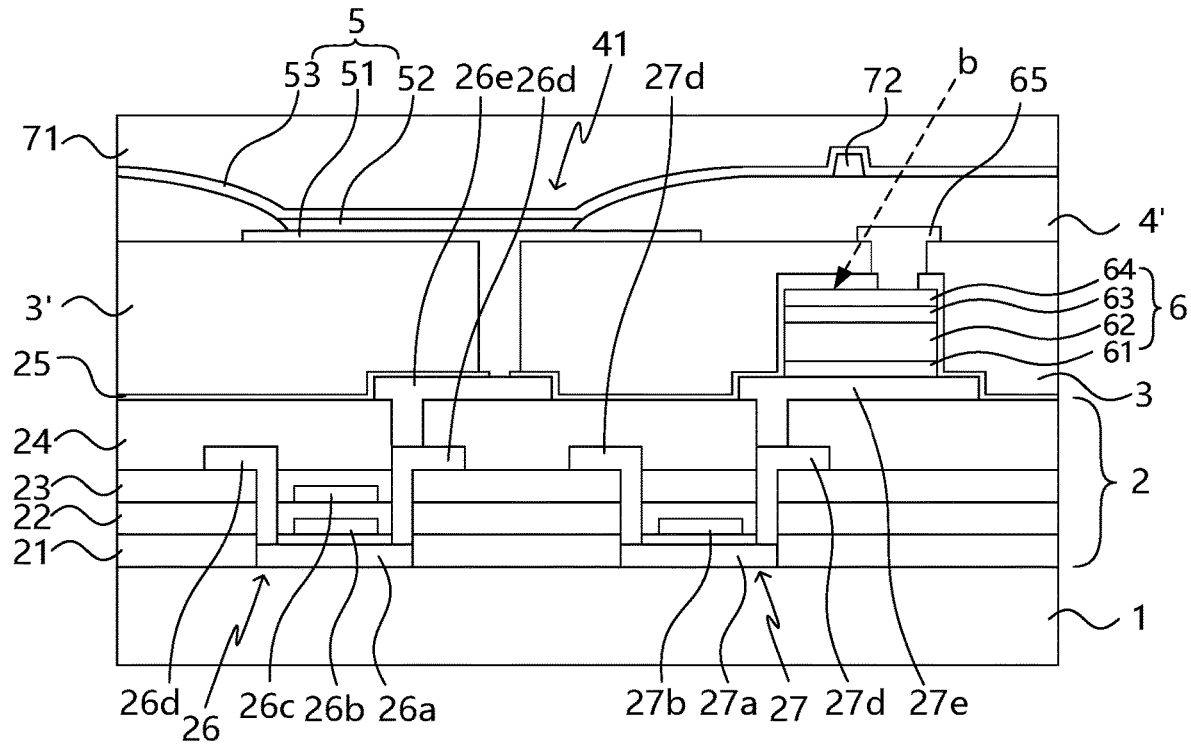

Referring to FIGS. 5-7, in other embodiments, the first TFT 26 or the second TFT 27 may also include one or more than three gate layers and corresponding gate insulating layers.

Referring to FIGS. 1 to 10, in some embodiments, a plurality of light-emitting elements 5 are located on one side of the driving circuit layer 2 away from the substrate 1, and electrically connected to the plurality of first thin film transistors respectively.

In some embodiments, at least one light-emitting element 5 of the plurality of light-emitting elements 5 is an OLED. The OLED includes an anode layer 51, an organic light-emitting layer 52, and a cathode layer 53. In FIGS. 1 to 7, the display panel further includes a planarization layer 3 located between the driving circuit layer 2 and the plurality of light-emitting elements 5. The anode layer 51 is located on one side of the planarization layer 3 away from the driving circuit layer 2, and electrically connected to the first electrode of the first TFT 26 (for example, the second source and drain layer 26e of the first TFT 26) through a via hole within the planarization layer 3.

The organic light-emitting layer 52 is arranged on one side of the anode layer 51 away from the driving circuit layer 2, and the cathode layer 53 is arranged on one side of the organic light-emitting layer 52 away from the driving circuit layer 2. The organic light-emitting layer 52 may include, for example, a light-emitting function layer such as an electron injection layer, an electron blocking layer, an electron transport layer, a light-emitting layer, a hole injection layer, a hole blocking layer, or a hole transport layer. In other embodiments, the light-emitting element 5 may also be a light-emitting diode LED, a quantum dot light-emitting diode QLED, or the like.

For the plurality of light-emitting elements 5, they are electrically connected to the corresponding plurality of first TFTs 26 through via holes respectively. For example, each light-emitting element 5 corresponds to one first TFT 26 in the driving circuit layer 2. Correspondingly, the planarization layer 3 below each light-emitting element 5 is provided with a via hole, so as to implement that the light-emitting element 5 is electrically connected to a first electrode of the corresponding first TFT 26.

In some embodiments, the photosensitive element 6 is configured to realize the fingerprint sensing in the display panel, so as to be used as a fingerprint sensor. In other embodiments, the photosensitive element 6 may also be applied in other aspects, such as gesture recognition.

Referring to FIGS. 1 to 10, in some embodiments, the photosensitive element 6 is located between adjacent light-emitting elements 5 among the plurality of light-emitting elements 5 within the planarization layer, and electrically connected to the second TFT 27. Along the vertical direction from bottom to top as shown in FIG. 1, the photosensitive element 6 may include an N-type amorphous silicon layer 61, an amorphous silicon layer 62 and a P-type amorphous silicon layer 63 that are sequentially stacked. In FIGS. 1 to 10, the photosensitive element 6 may further include an indium tin oxide (ITO) anode conductive layer 64 and a top electrode layer 65. The N-type amorphous silicon layer 61 is in contact with and electrically connected to the second electrode of the second TFT 27 (for example, the second source and drain layer 27e of the second TFT 27). In other embodiments, the photosensitive elements 6 of other structures may also be used. For example, a silicon dioxide layer is provided between the N-type amorphous silicon layer 61 and the P-type amorphous silicon layer 63, or the ITO anode conductive layer is replaced by the IZO or AZO anode conductive layer.

In FIGS. 1 to 10, the second passivation layer 25 covers the first passivation layer 24, the second source and drain layer 26e, the fourth source and drain layer 27e, and a part of the photosensitive element 6 below the top electrode layer 65. The planarization layer 3 is located on one side of the driving circuit layer 2 away from the substrate 1. In FIG. 1, the planarization layer 3 covers the surface of the second passivation layer 25 on one side away from the driving circuit layer 2, so as to form a flat surface for setting of the anode layer 51 of the light-emitting element 5 and the top electrode layer 65 of the photosensitive element 6.

Referring to FIGS. 1 to 10, in some embodiments, the display panel further includes a pixel defining layer 4. The pixel defining layer 4 is located on one side of the planarization layer 3 away from the driving circuit layer 2, and includes a plurality of openings 41. The pixel defining layer 4 is divided into a light-emitting area and a non-light-emitting area by a plurality of openings 41. The anode layer 51 of the light-emitting element 5 is located between the pixel defining layer 4 and the planarization layer 3, and includes an exposed portion relative to at least one of the plurality of openings 41. The organic light-emitting layer 52 is located within at least one of the plurality of openings 41, and covers the surface of the exposed portion of the anode layer 51. The cathode layer 53 covers the surfaces of the pixel defining layer 4 and the organic light-emitting layer 52.

In FIGS. 1 to 10, the pixel defining layer 4 may also be provided with a support 72 for mask machining and a thin film encapsulation layer 71 for encapsulation. On one side of the film encapsulation layer 71 away from the substrate 1, it is also possible to adhere a polarizer, a cover plate and the like by an optically transparent adhesive.

For the stray light from the environment beyond the display panel, it enters the photosensitive element 6 in two optical paths: one is ambient light a which passes through a gap between the devices of the display panel from above of the display panel in FIG. 1 and reaches a bottom layer TFT channel of the second TFT 27 to which the photosensitive element 6 is connected (its optical path is shown by the dotted line with arrows); and the other is ambient light b that is directly irradiated onto the ITO anode conductive layer 64 of the photosensitive element 6 from above of the display panel (its optical path is shown by the dashed line with arrows).

In some embodiments, the second TFT 27 uses a top gate structure. That is, the first gate layer 27b is located above the TFT channel, so that it is difficult for the ambient light a to directly irradiate the TFT channel from above. For a medium such as a glass substrate which can realize the light transmission, the ambient light a can enter the substrate 1 and then enter the TFT channel by reflection of the lower surface of the substrate 1.

In order to solve the adverse effects of the ambient light a on the photosensitive element 6, in some embodiments, the display panel further includes a light-blocking element. The light-blocking element is located on the optical path of the ambient light from outside of the display panel transmitted to the TFT channel of the second TFT 27 in the display panel, so as to reduce ambient light transmitted to the TFT channel of the second TFT 27. In this way, it is possible to effectively reduce or eliminate the defects that the ambient light results in saturation of the photosensitive element or increase of the leakage current, thereby improving the sensitivity of the photosensitive element 6.

Referring to FIG. 1, in some embodiments, the light-blocking element includes a first light-shielding layer 91. The material of the first light-shielding layer 91 is a light-absorbing material (for example, a black photoresist material). The first light-shielding layer 91 is located between the driving circuit layer 2 and the plurality of light-emitting elements 5 to block the ambient light from entering the driving circuit layer 2 and serve as the planarization layer 3 in this embodiment. In this way, when the ambient light is irradiated onto the planarization layer 3, it can be absorbed by the light-absorbing material of the planarization layer 3, thereby preventing or reducing the ambient light from transmitting through the planarization layer 3 into the driving circuit layer 2, and further reducing the ambient light of the TFT channel entering the second TFT 27.

In FIG. 1, the photosensitive element 6 is arranged within the first light-shielding layer 91. In order to prevent the light-absorbing material of the first light-shielding layer from affecting the normal light sensitivity of the photosensitive element 6, referring to FIG. 1, in some embodiments, the photosensitive element 6 is exposed from one side of the first light-shielding layer 91 away from the driving circuit layer 2, so as to prevent the first light-shielding layer 91 from shielding the ITO anode conductive layer of the photosensitive element 6. In other embodiments, the photosensitive element 6 is not exposed from the first light-shielding layer 91 and is provided on one side of the first light-shielding layer 91 away from the driving circuit layer 2, and the light-absorbing material above the ITO anode conductive layer 64 of the photosensitive element 6 is very thin (for example, the thickness is less than 2000A) to ensure the transmittance of the light.

Figure 2:
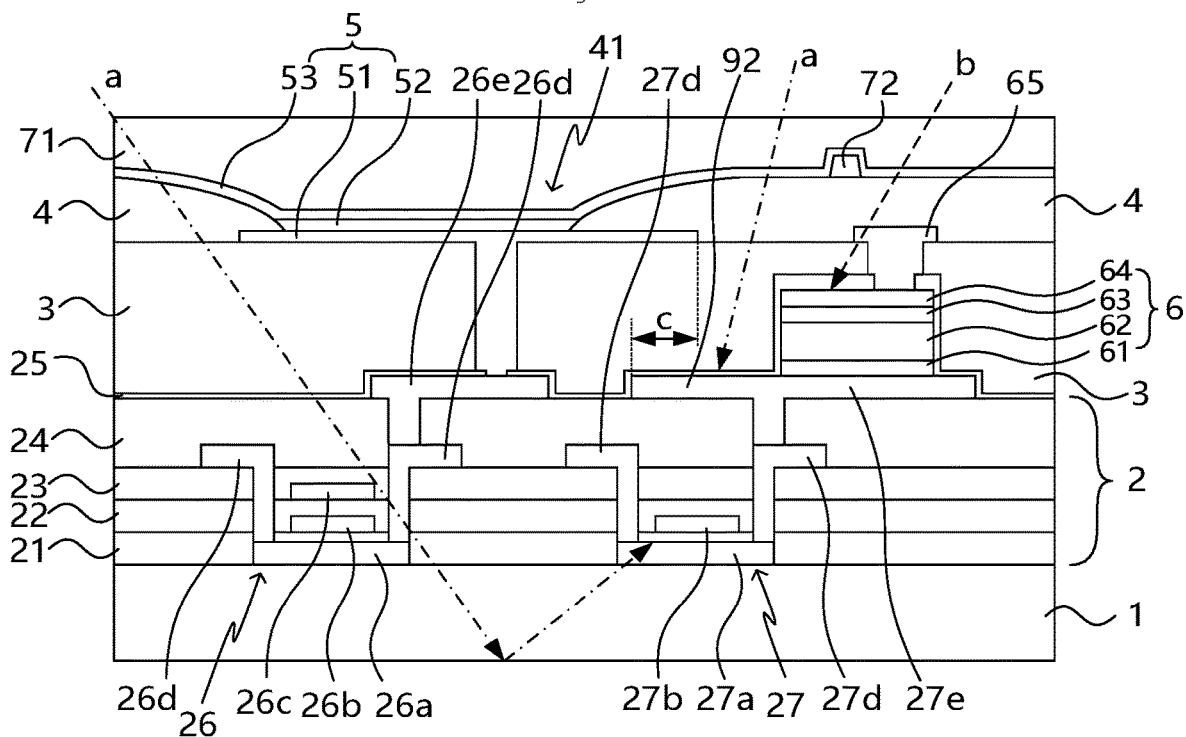

Referring to FIGS. 2, 4, 6 and 7, in some embodiments, the second electrode of the second TFT 27 (for example, the second source and drain layer 27e of the second TFT 27) is in the same layer as the first electrode of the first TFT 26 (for example, the second source and drain layer 26e of the first TFT 26). The light-blocking element includes an extension portion 92 of the second electrode of the second TFT 27 extending toward the first electrode of the first TFT 26. The orthographic projection of the extension portion 92 on the substrate 1 at least partially overlaps with the orthographic projection of the anode layer 51 on the substrate 1. In FIG. 2, the double arrow shows a portion c where the extension portion 92 of the second source and drain layer 27e overlaps with the anode layer 51 in projection. In other words, the area of the second electrode of the second TFT is increased so that the second electrode partially overlaps with the anode layer of the light-emitting element in projection, thereby reducing the aperture ratio of the display panel and reducing the ambient light entering from a gap between the devices of the display panel.

In order to make the anode layer of the light-emitting element more flat during machining, in some embodiments, the orthographic projection of the photosensitive element 6 on the substrate 1 does not overlap with the orthographic projection of the anode layer 51 on the substrate 1. In FIG. 2, the extension portion of the second source and drain layer 27e is located directly below the anode layer 51, and the photosensitive element 6 is not located directly below the anode layer 51.

Referring to FIGS. 3 to 5 and 7, in some embodiments, the substrate 1 is a glass substrate, and the light-blocking element includes a light-absorbing layer 93. The light-absorbing layer 93 is located on the surface of one side of the glass substrate away from the planarization layer 3 (i.e., the lower surface of the glass substrate in FIG. 2). In this way, when the stray light from the environment beyond the display panel enters the interior of the display panel and reaches the lower surface of the substrate 1, the ambient light can be absorbed by the light-absorbing layer 93, thereby lessening the ambient light reflected to the TFT channel of the second TFT 27 as much as possible and reducing the reflectivity of the substrate 1. The light-absorbing layer 93 may be formed of a black material with a high light absorbance, such as a black matrix (referred to as BM), a copper film with a graphite layer, or other film materials with a graphite layer.

Figure 4:
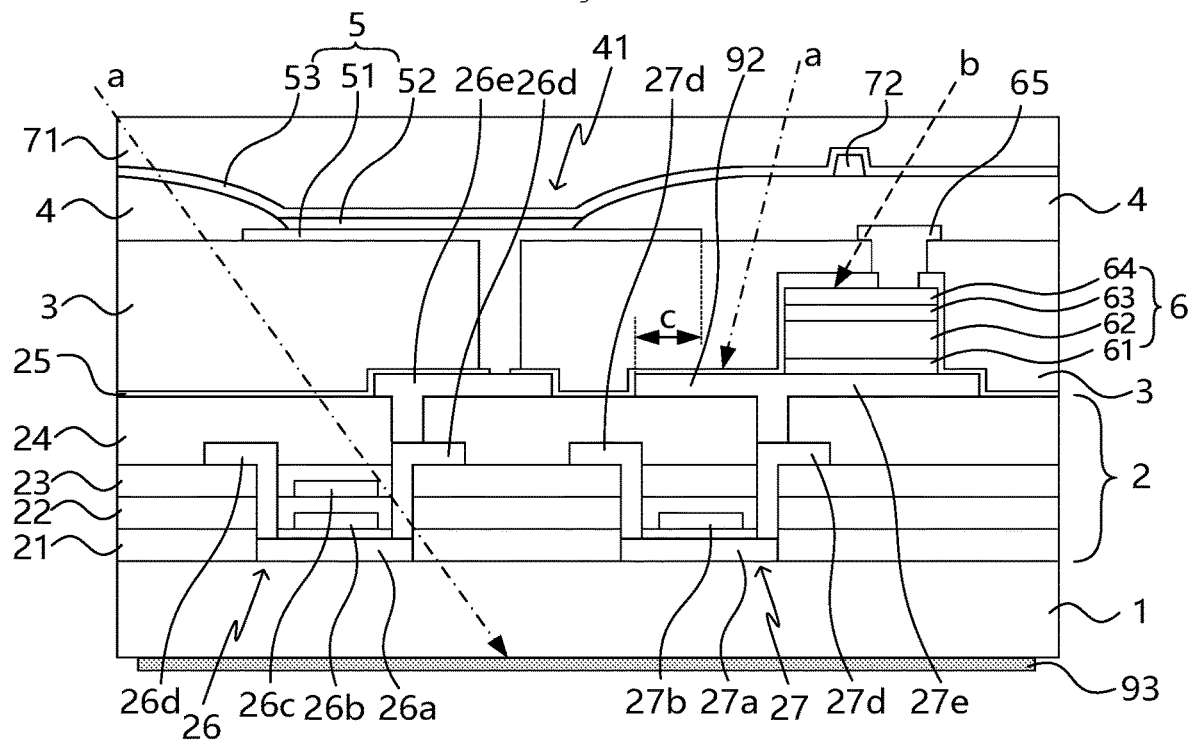

In FIG. 4, the extension portion 92 of the second electrode of the second TFT 27 can effectively block a part of the ambient light entering from a gap between the devices of the display panel. The light-absorbing layer 93 is provided on the surface of one side of the glass substrate away from the planarization layer 3, so that it is possible to further eliminate the possibility that the light reflected between the second electrode and the anode layer 51 enters the TFT channel of the second TFT 27.

Referring to FIGS. 5-7, in order to further reduce the reflected ambient light reaching the TFT channel of the second TFT 27, in some embodiments, the second TFT 27 includes: an active layer 27a and a first gate layer 27b. The active layer 27a is located on one side of the substrate 1 adjacent to the photosensitive element 6. The first gate layer 27b is located on one side of the active layer 27a away from the substrate 1. The light-blocking element may include a second gate layer 94. The second gate layer 94 is located between the substrate 1 and the active layer 27a. The first gate layer 27b is electrically connected to the second gate layer 94 through a via hole. At least part of the orthographic projection of the second gate layer 94 on the substrate 1 overlaps with the orthographic projection of the first gate layer 27b on the substrate, so that the second gate layer 94 blocks the ambient light reflected by the substrate from entering the TFT channel of the second TFT 27.

Referring to FIG. 6, in other embodiments, when the second TFT 27 uses a double gate structure, the light-absorbing layer 93 may not be provided on the surface of one side of the substrate away from the planarization layer 3. In addition, in FIGS. 5-7, the first TFT 26 further includes a third gate layer 26f which may be formed by the same deposition process as the second gate layer 94. The third gate layer 26f is located between the first active layer 26a and the substrate 1, and electrically connected to the first gate layer 26b through a via hole.

In the embodiment shown in FIG. 7, the light-blocking element may include the extension portion 92 of the aforementioned second TFT 27, the light-absorbing layer 93 and the second gate layer 94. The triple light-blocking measures can allow that the ambient light a cannot reach the TFT channel of the second TFT 27 as much as possible.

Figure 3:
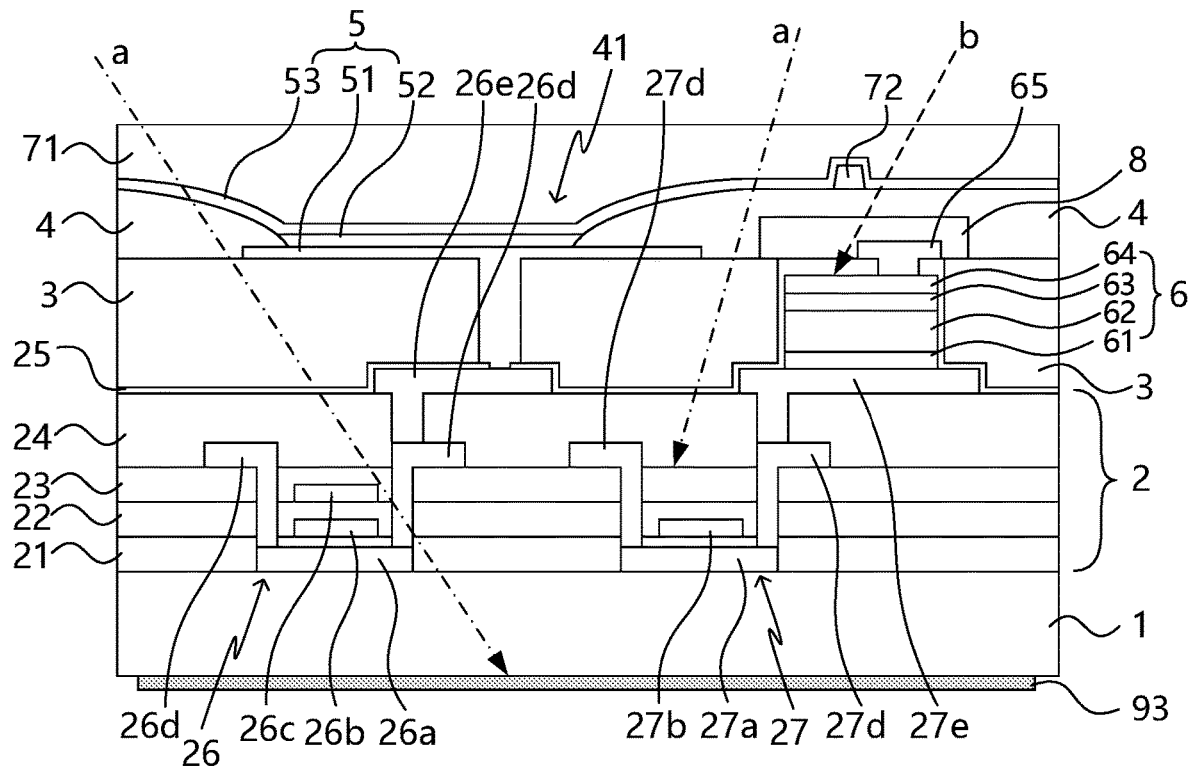

For the ambient light b directly irradiated onto the ITO anode conductive layer 64 of the photosensitive element 6 from above of the panel, referring to FIGS. 3 to 5, in some embodiments, the display panel further includes a filter layer 8 located on one side of the photosensitive element 6 away from the driving circuit layer 2. In FIGS. 3 to 5, the filter layer 8 is located within the pixel defining layer 4, and covers one side of the photosensitive element 6 away from the driving circuit layer 2. The material of the filter layer 8 is a filter material, for example a color photoresist material commonly used in the liquid crystal display device. The filter material is configured to be a filter material that intercepts light with a wavelength higher than a set wavelength and transmits light with a wavelength not higher than a set wavelength. The filter layer 8 may be formed by coating over the photosensitive element. After the filter layer 8 is formed, a conventional pixel defining layer 4 is then fabricated, thereby simplifying the manufacturing process and reducing the material requirements and the process difficulties.

In addition to using the manner of the filter layer 8, referring to FIG. 6, in some embodiments, at least one of the planarization layer 3' and the pixel defining layer 4' may use a filter material. The filter material is configured to intercept light with a wavelength higher than a set wavelength and transmit light with a wavelength not higher than a set wavelength.

For the embodiments of FIGS. 3, 5 and 8-10, when the photosensitive element is applied in fingerprint recognition, since the photosensitive element for fingerprint recognition is located below the finger during use, and the finger can usually transmit the ambient light having a wavelength of greater than 600 nm, in some embodiments, a filter material with a set wavelength of 550-620 nm (which may be further selected to be 600 nm) is used such that this material intercepts light with a wavelength higher than a set wavelength, and transmits light below a set wavelength. In this way, during fingerprint recognition, the ambient light transmitted through the finger cannot be further transmitted to the light-receiving surface of the photosensitive element, thereby reducing the adverse effects of the ambient light on the photosensitive element.

Figure 10:
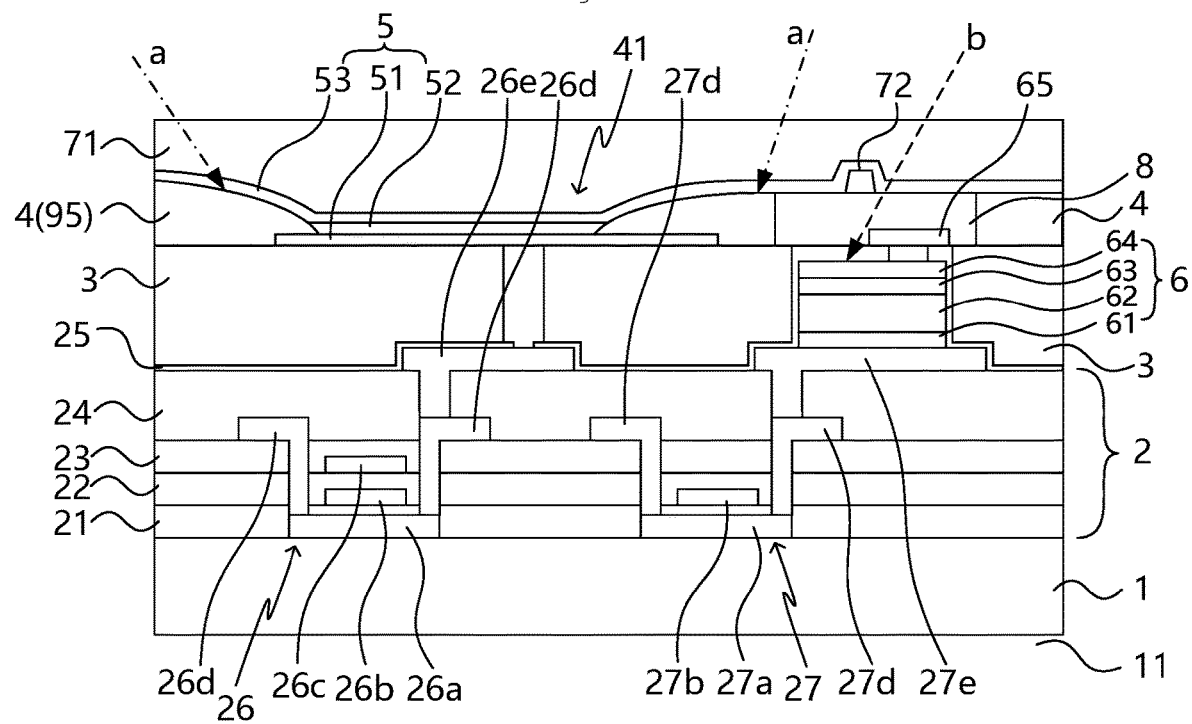

Referring to FIGS. 10, in some embodiments, the light-blocking element includes a second light-shielding layer 95, wherein the second light-shielding layer 95 as the pixel defining layer 4 is located on one side of the driving circuit layer 2 away from the substrate 1 and configured to block the ambient light from entering the driving circuit layer 2 so as to reduce or prevent the ambient light a irradiated on the TFT channel of the second TFT 27 connected to the photosensitive element 6. The material of the second light-shielding layer 95 is a light-absorbing material (for example, a black photoresist material).

In FIG. 10, the filter layer 8 is arranged within the second light-shielding layer 95. In order to reduce the ambient light b directly irradiated on the photosensitive element 6, the filter layer 8 covers one side of the photosensitive element 6 away from the substrate 1, and is exposed from one side of the second light-shielding layer 95 away from the drive circuit layer 2, so as not to shield the filter layer 8. In other embodiments, the filter layer 8 is not exposed from one side of the second light-shielding layer 95 away from the driving circuit layer 2, and the light-absorbing material above the filter layer 8 is very thin (for example, the thickness is less than 2000 Å), so as to ensure the transmittance of the light.

Based on the foregoing embodiments of the display panel, the present disclosure also provides a display device including any of the foregoing embodiments of the display panel. The OLED display device may be any product or member having a display function, such as a mobile phone, a tablet computer, a television, a display, a notebook computer, a digital photo frame, a navigator, and the like.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display panel comprising:
   a substrate;
   a driving circuit layer comprising a plurality of first thin film transistors and a second thin film transistor located on the substrate, wherein the second thin film transistor is located between adjacent first thin film transistors among the plurality of first thin film transistors;
   a plurality of light-emitting elements located on one side of the driving circuit layer away from the substrate, and electrically connected to the plurality of first thin film transistors respectively;
   a photosensitive element located between adjacent light-emitting elements among the plurality of light-emitting elements and electrically connected to the second thin film transistor; and a light-blocking element located on an optical path of ambient light from outside the display panel transmitted to a thin film transistor channel of the second thin film transistor within the display panel, so as to reduce ambient light transmitted to the thin film transistor channel of the second thin film transistor;

wherein:

at least one of the plurality of light-emitting elements is an organic light-emitting diode comprising an anode layer electrically connected to first electrodes of the first thin film transistors;

a second electrode of the second thin film transistor is in the same layer as the first electrodes of the first thin film transistors; and the light-blocking element comprises an extension portion of the second electrode extending toward the first electrodes, wherein an orthographic projection of the extension portion on the substrate at least partially overlaps with an orthographic projection of the anode layer on the substrate.

2. The display panel according to claim 1, wherein an orthographic projection of the photosensitive element on the substrate does not overlap with an orthographic projection of the anode layer on the substrate.

3. The display panel according to claim 1, further comprising a planarization layer located between the driving circuit layer and the plurality of light-emitting elements, wherein:

the photosensitive element is located within the planarization layer; and the anode layer of the organic light-emitting diode is located on one side of the planarization layer away from the driving circuit layer, and electrically connected to the first electrodes of the first thin film transistors through a via hole within the planarization layer.

4. The display panel according to claim 1, wherein the substrate is a glass substrate, and the light-blocking element comprises a light-absorbing layer located on a surface of one side of the glass substrate away from the driving circuit layer.

5. The display panel according to claim 1, wherein the second thin film transistor further comprises:

an active layer located on one side of the substrate adjacent to the photosensitive element; and a first gate layer located on one side of the active layer away from the substrate;

wherein the light-blocking element comprises:

a second gate layer located between the substrate and the active layer, wherein at least part of an orthographic projection of the second gate layer on the substrate overlaps with an orthographic projection of the first gate layer on the substrate.

6. The display panel according to claim 1, wherein the light-blocking element comprises a first light-shielding layer, the first light-shielding layer, as a planarization layer, is located between the driving circuit layer and the plurality of light-emitting elements to block ambient light from entering the driving circuit layer.

7. The display panel according to claim 6, wherein the photosensitive element is located within the first light-shielding layer and exposed on one side of the first light-shielding layer away from the driving circuit layer.

8. The display panel according to claim 1, further comprising:

a planarization layer located between the driving circuit layer and the plurality of light-emitting elements; and a pixel defining layer located on one side of the planarization layer away from the driving circuit layer, wherein material of at least one of the planarization layer or the pixel defining layer is a filter material configured to intercept light with a wavelength higher than a set wavelength and transmit light with a wavelength not higher than the set wavelength.

9. The display panel according to claim 1, further comprising a filter layer located on one side of the photosensitive element away from the driving circuit layer, wherein material of the filter layer is a filter material configured to intercept light with a wavelength higher than a set wavelength, and transmit light with a wavelength not higher than the set wavelength, and at least part of an orthographic projection of the filter layer on the substrate overlaps with an orthographic projection of the photosensitive element on the substrate.

10. The display panel according to claim 9, wherein:

the light-blocking element comprises a second light-shielding layer, the second light-shielding layer, as a pixel defining layer, is located on one side of the driving circuit layer away from the substrate; and the filter layer is arranged within the second light-shielding layer, and exposed on one side of the second light-shielding layer away from the driving circuit layer.

11. The display panel according to claim 8, wherein the set wavelength is 550-620 nm.

12. The display panel according to claim 11, wherein the set wavelength is 600 nm.

13. The display panel according to claim 6, wherein at least one of the plurality of light-emitting elements is an organic light-emitting diode comprising:

an anode layer located between the pixel defining layer and the planarization layer, and having an exposed portion relative to at least one of a plurality of openings of the pixel defining layer;

an organic light-emitting layer located within at least one of the plurality of openings and covering a surface of the exposed portion of the anode layer; and a cathode layer covering surfaces of the pixel defining layer and the organic light-emitting layer.

14. The display panel according to claim 1, wherein the photosensitive element comprises: an N-type amorphous silicon layer, an intrinsic amorphous silicon layer, and a P-type amorphous silicon layer that are sequentially stacked along a direction away from the driving circuit layer.

15. The display panel according to claim 1, wherein the photosensitive element is applied for fingerprint identification.

16. A display device comprising the display panel according to claim 1.

17. The display panel according to claim 1, wherein the plurality of light-emitting elements are in one-to-one correspondence with the plurality of first thin film transistors.

18. The display panel according to claim 9, wherein the set wavelength is 550-620 nm.

19. The display panel according to claim 18, wherein the set wavelength is 600 nm.

* * * * *